(12) United States Patent
Chiba

(10) Patent No.: US 8,012,880 B2
(45) Date of Patent: Sep. 6, 2011

(54) METHOD OF MANUFACTURING SEMICONDUCTOR DEVICE

(75) Inventor: Yuki Chiba, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 570 days.

(21) Appl. No.: 12/216,155

(22) Filed: Jun. 30, 2008

(65) Prior Publication Data

US 2009/0029558 A1 Jan. 29, 2009

Related U.S. Application Data

(60) Provisional application No. 60/960,163, filed on Sep. 18, 2007.

(30) Foreign Application Priority Data

Jul. 2, 2007 (JP) ................................. 2007-174307

(51) Int. Cl.
*H01L 21/302* (2006.01)
*B44C 1/22* (2006.01)

(52) U.S. Cl. ........... 438/725; 438/710; 438/719; 216/67
(58) Field of Classification Search .................. 438/710, 438/719, 725; 216/67
See application file for complete search history.

(56) References Cited

U.S. PATENT DOCUMENTS

| 2007/0059933 A1 | 3/2007 | Tahara et al. |
| 2007/0122752 A1 | 5/2007 | Asako et al. |
| 2010/0200990 A1* | 8/2010 | Oku et al. ..................... 257/741 |

FOREIGN PATENT DOCUMENTS

| JP | 2005-251837 | 9/2005 |
| JP | 2007-80850 | 3/2007 |
| JP | 2007-157768 | 6/2007 |
| WO | 2006/020344 | 2/2006 |

OTHER PUBLICATIONS

Japanese Office Action mailed on Dec. 22, 2009 for priority Japanese Application No. 2007-174307 with English translation.

* cited by examiner

*Primary Examiner* — Shamim Ahmed
(74) *Attorney, Agent, or Firm* — Smith, Gambrell & Russell, LLP

(57) ABSTRACT

The present invention relates to a method of manufacturing a semiconductor device using a substrate including an organic low dielectric constant film containing a silicon, a carbon, an oxygen, and a hydrogen, with a resist pattern being formed on an upper layer side of the low dielectric constant film. The method comprising: an etching step in which the low dielectric constant film is etched by a plasma; an ashing step following to the etching step, in which the resist pattern is ashed by a plasma that is rich in oxygen radicals in such a manner that a relative dielectric constant of the low dielectric constant film can become 5.2 or more; and a recovering step following to the ashing step, in which an organic gas is supplied to the low dielectric constant film so as to recovery a damage of the low dielectric constant film caused by the plasma.

7 Claims, 10 Drawing Sheets

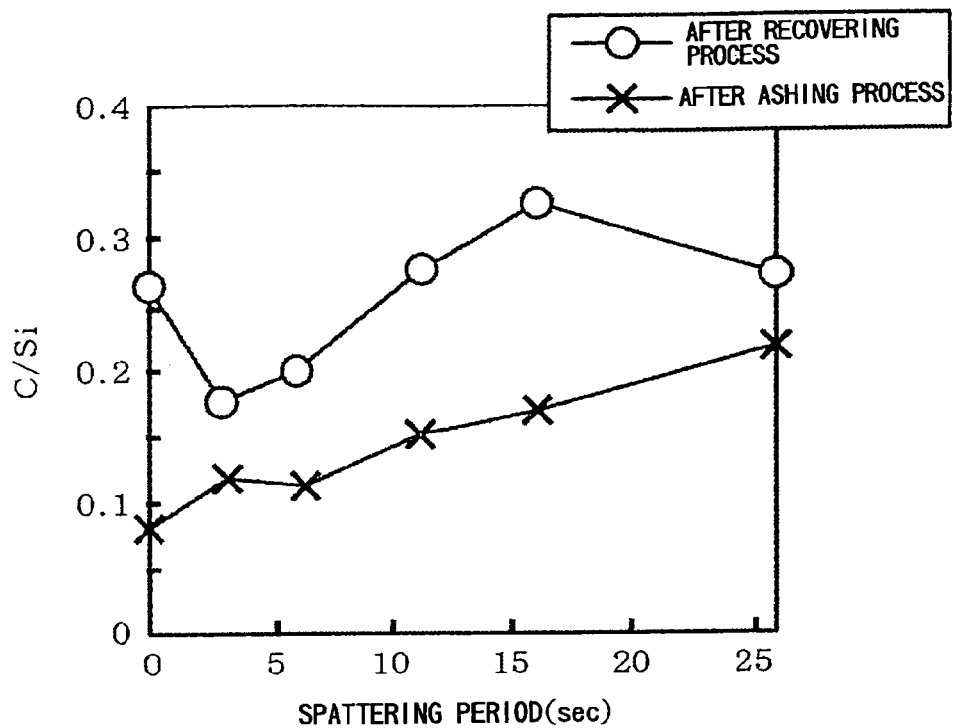
F I G. 9 A
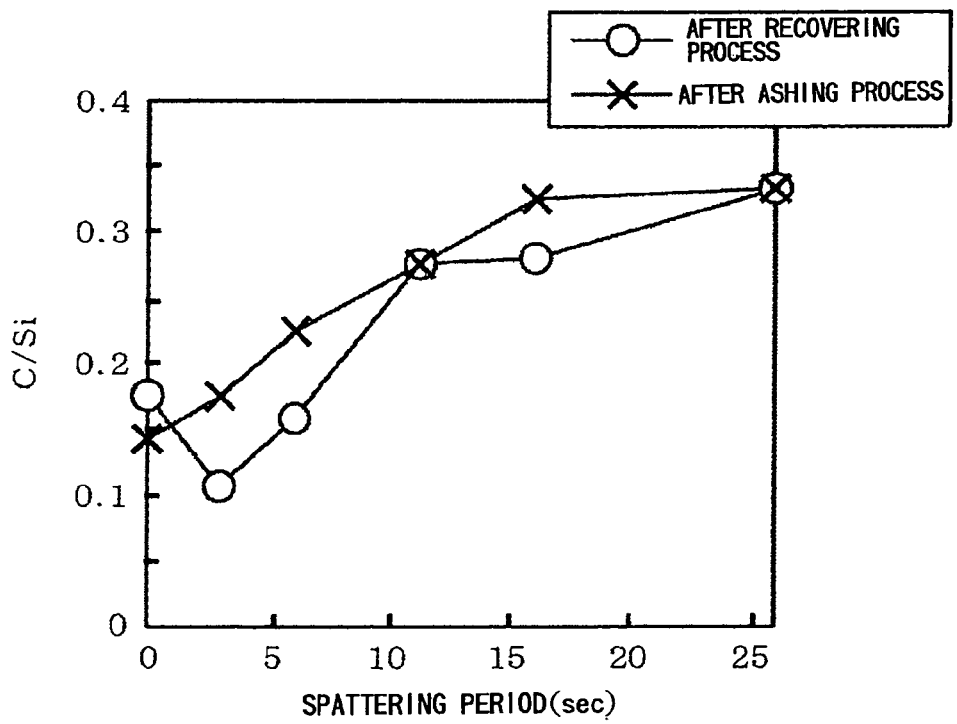
F I G. 9 B (a)

(b)

(c)

METHOD OF MANUFACTURING SEMICONDUCTOR DEVICE

CROSS REFERENCE TO RELATED APPLICATIONS

This application claims priority from U.S. Provisional Application No. 60/960,163 filed on Sep. 18, 2007, and Japanese Patent Application No. 2007-174307 filed on Jul. 2, 2007. The entire contents of these applications are incorporated herein by reference.

FIELD OF THE INVENTION

The present invention relates to a technique used in a manufacturing step of a semiconductor device, wherein, after an organic low dielectric constant film that is an interlayer dielectric film is etched, a resist thereof is ashed, and then a damage of the low dielectric constant film is recovered.

BACKGROUND ART

In a dual damascene step as a method of forming a multi-layer wiring structure in a semiconductor device, there are formed, in an interlayer dielectric film, a via hole through which a wiring of an upper layer and a wiring of a lower layer are connected, and a trench (groove) in which a wiring of the upper layer is embedded. Copper as a wiring metal is embedded in these recesses.

In order to form the recesses such as via holes and trenches in the interlayer dielectric film, an etching step is performed by a plasma obtained from a process gas. Thereafter, a resist is ashed by a plasma obtained from an oxygen gas or a carbonic dioxide gas.

With a view to accelerating a signal transmission, formation of an interlayer dielectric film out of a material having a low relative dielectric constant has been studied. An SiCOH film is known as a representative low dielectric constant film.

However, in the above etching step and the above ashing step, the SiCOH film may be damaged by the plasma. In particular, in the ashing step, the SiCOH film may be seriously damaged because the SiCOH film is an organic film, while an oxygen gas is used in the ashing step. To be specific, electric properties of the SiCOH film may be considerably deteriorated.

As shown in FIG. 10A, this damage is caused when a connection between Si and a methyl group ($CH_3$), which form the SiCOH film, is disconnected by the plasma of an oxygen gas, so that the methyl group, which has been disconnected from Si, is desorbed from the SiCOH film. On the other hand, the silicon (Si) from which the methyl group has been disconnected is prone to absorb moisture. Thus, the silicon takes therein moisture in an atmospheric air and in a process gas, or moisture generated by a reaction between oxygen in the process gas and hydrogen in the methyl group, resulting in further deterioration of the electric properties of the SiCOH film. Such a damage may invite various problems such as a broadening of a line width of a pattern after a wafer is washed, an increase in relative dielectric constant, an increase in leak current, and a deterioration in reliability caused by the moisture absorption.

Thus, a process for recovering the damage is performed according to the following manner. Namely, as shown in FIG. 10B, a silazane-containing gas including methyl groups is supplied to the SiCOH film so as to add, as shown in FIG. 10C, the methyl groups to the silicon from which another methyl group has been disconnected.

The ashing step is performed by using a parallel-plate type plasma processing apparatus under a condition that a damage given to the low dielectric constant film is restrained as much as possible. For example, a power to be applied to an upper electrode is set at about 300 W with respect to a 8-inch semiconductor wafer (referred to as "wafer" below). When the process gas is made plasma with this low application power, oxygen ions are mainly generated. The ashing step is performed by means of these oxygen ions.

However, as shown in FIG. 11, a surface part of a SiCOH film 100, in which molecules have become smaller because of the desorption of the methyl groups, provides a dense layer 101 of a higher density by an energy of the oxygen ions included in the plasma of the oxygen gas. Since this dense layer 101 acts as a solid obstacle, it is difficult for the silazane-containing gas having relatively larger molecules to be permeated into the SiCOH film 100. Thus, as shown in FIG. 11, only a superficial part of the dense layer 101 can be recovered by the recovery process.

JP2005-251837A (particularly, claim 1 and section 0037) describes that, when a resist pattern on an upper layer side of an organic low dielectric constant film is ashed, an application power to an upper electrode is not more than 0.81 $W/cm^2$ per unit surface area of a wafer (an application power to the upper electrode with respect to an 8-inch wafer is not more than 255 W). However, this condition is an oxygen-ion rich condition, and thus the above problems cannot be solved.

SUMMARY OF THE INVENTION

The present invention has been made in view of the above circumstances. The object of the present invention is to provide a method of advantageously recovering an organic low dielectric constant film which has been damaged by a plasma in an etching process and an ashing process.

The present invention is a method of manufacturing a semiconductor device using a substrate including an organic low dielectric constant film containing a silicon, a carbon, an oxygen, and a hydrogen, with a resist pattern being formed on an upper layer side of the low dielectric constant film, the method comprising: an etching step in which the low dielectric constant film is etched by a plasma; an ashing step following to the etching step, in which the resist pattern is ashed by a plasma that is rich in oxygen radicals in such a manner that a relative dielectric constant of the low dielectric constant film can become 5.2 or more; and a recovering step following to the ashing step, in which an organic gas is supplied to the low dielectric constant film so as to recovery a damage of the low dielectric constant film caused by the plasma.

According to the present invention, the resist pattern is ashed by purposely using the plasma that is rich in oxygen radicals, and thus the damage degree of the low dielectric constant film caused by the plasma in the ashing step is made worse. However, this process can restrain formation of a dense layer on the low dielectric constant film, whereby the organic gas can permeate deeply into the low dielectric constant film in the succeeding recovering step. Accordingly, a recovery ratio of the damage of the low dielectric constant film can be improved in the end.

Specifically, in a case of an SiCOH film, the ashing process is performed such that a relative dielectric constant of the SiCOH film becomes 5.2 or more. In this case, the ashing process is performed under a radical-rich condition, so that formation of a dense layer can be restrained.

Alternatively, the present invention is a method of manufacturing a semiconductor device using a substrate including an organic low dielectric constant film containing a silicon, a carbon, an oxygen, and a hydrogen, with a resist pattern being formed on an upper layer side of the low dielectric constant film, the method comprising: an etching step in which the substrate is loaded into a plasma processing apparatus and the low dielectric constant film is etched by a plasma; an ashing step following to the etching step, in which, by using a parallel-plate type plasma processing apparatus, under a process pressure set at a value between 1.33 Pa and 6.67 Pa, an oxygen gas is made plasma by applying a power for generating a plasma to an upper electrode in such a manner that the power for generating a plasma applied to the substrate on a lower electrode is between 1.91 W/cm$^2$ and 3.18 W/cm$^2$ per unit-surface area of the substrate, and the resist pattern is ashed by the plasma of the oxygen gas; and a recovering step following to the ashing step, in which an organic gas is supplied to the low dielectric constant film so as to recovery of a damage of the low dielectric constant film caused by the plasma.

Due to the performance of the ashing step stipulated in this invention, the ashing process is performed under the radical-rich condition, so that formation of a dense layer on the low dielectric constant film can be restrained. As a result, the organic gas can permeate deeply into the low dielectric constant film in the recovering step, whereby a recovery ratio of the damage of the low dielectric constant film can be improved in the end.

In addition, the present invention is a storage medium storing a computer program operatable on a computer, wherein the computer program includes steps for performing the method of manufacturing a semiconductor device having the above features.

BRIEF DESCRIPTION OF THE DRAWINGS

FIGS. 9A and 9B are characteristic graphs showing data obtained in Experiment 2;

DETAILED DESCRIPTION OF THE INVENTION

An embodiment of the present invention is described below. The present invention is a method of performing a plasma process and a recovery process to a semiconductor wafer (hereinafter referred to as "wafer"). An example of an apparatus for performing the present method is described in the first place.

[Plasma Processing Apparatus]

Figure 1:
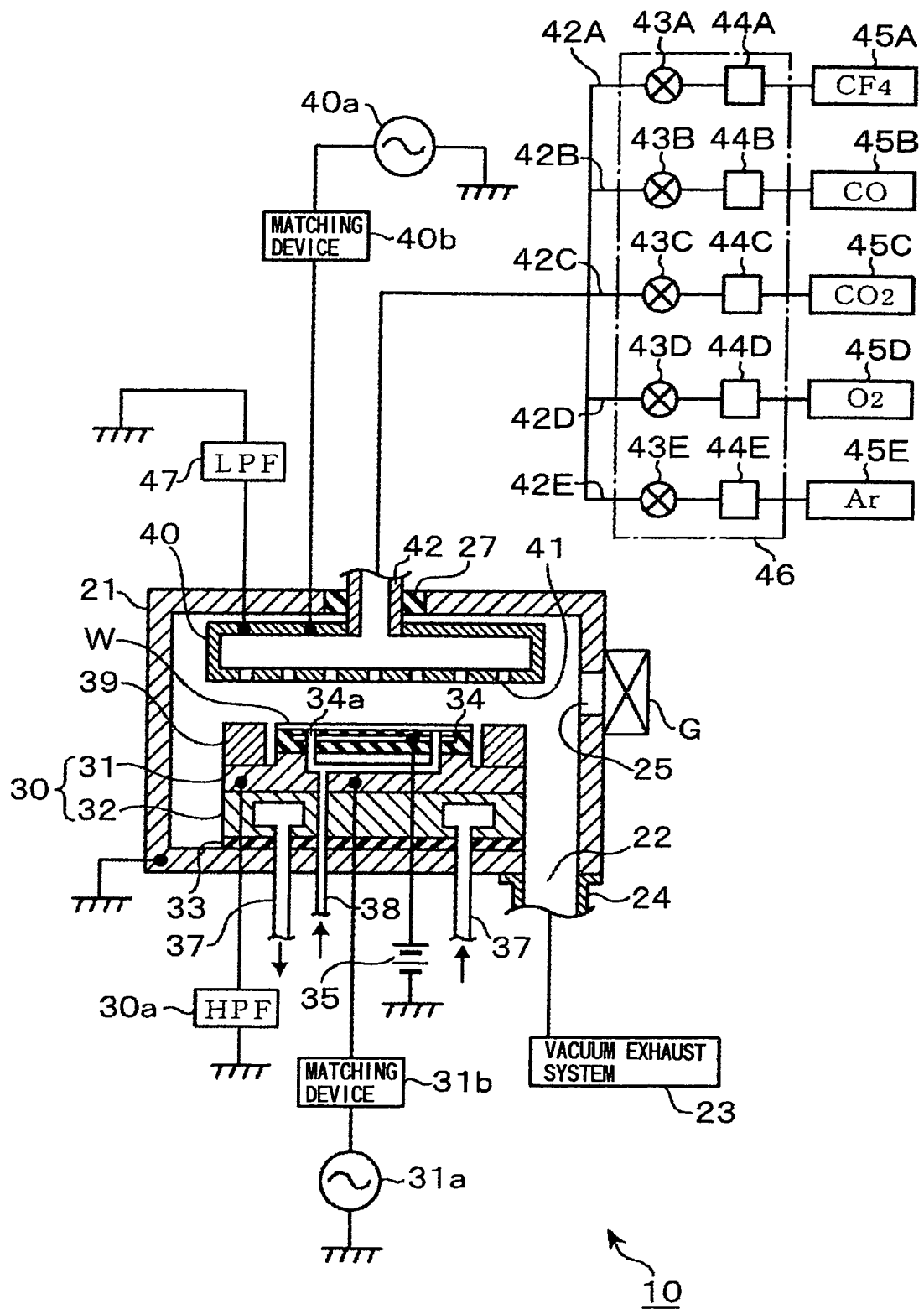
FIG. 1 is a longitudinal sectional view showing an example of a plasma processing apparatus used for performing an etching step and an ashing step in one embodiment of a method of manufacturing a semiconductor device according to the present invention.

At first, there is described an example of a parallel-plate type plasma processing apparatus for performing an etching process and an ashing process to a wafer W, with reference to FIG. 1.

A plasma processing apparatus 10 includes: a process vessel 21 formed of a vacuum chamber, a stage 30 located on a center of a bottom surface of the process vessel 21; and an upper electrode 40 disposed on an upper part of the process vessel 21.

A vacuum exhaust system 23 including a vacuum pump and the like is connected to an outlet port 22 formed in the bottom surface of the process vessel 21 through an exhaust pipe 24. A transfer port 25 for a wafer W is formed in a wall surface of the process vessel 21. The transfer port 25 is capable of being opened and closed by a gate valve G. The process vessel 21 is grounded.

The stage 30 is composed of a lower electrode 31 and a support body 32 that supports the lower electrode 31 from below. The stage 30 is located on the bottom surface of the process vessel 21 via an insulation member 33. Disposed on an upper part of the stage 30 is an electrostatic chuck 34 to which an electric voltage is applied from a high-voltage DC power source 35. Thus, a wafer W is electrostatically absorbed on the stage 30.

A temperature-adjusting flow path 37 through which a predetermined temperature-adjusting medium flows, is formed in the stage 30, so that a temperature of the wafer W can be adjusted to a desired temperature by the temperature-adjusting medium.

In addition, a gas flow path 38 through which a heat-conductive gas such as an He (helium) gas is supplied as a backside gas, is formed in the stage 30. The gas flow path 38 is opened at a plurality of positions in the upper surface of the stage 30. These openings are communicated with through-holes 34a formed in the electrostatic chuck 34.

The lower electrode 31 is grounded via a high-pass filter (HPF) 30a. A radiofrequency power source 31a supplying a frequency of 2 MHz is connected to the lower electrode 31 via a matching device 31b. A focus ring 39 is arranged along an outer periphery of the lower electrode 31 so as to surround the electrostatic chuck 34. When a plasma is generated, the plasma is adapted to focus on a wafer W placed on the stage 30 through the focus ring 39.

The upper electrode 40 is formed to have a hollow shape. In a lower surface of the upper electrode 40, there are formed, e.g., uniformly, a number of holes 41 for supplying a process gas into the process vessel 21 in a dispersed manner. Thus, a gas showerhead is structured. A gas introducing pipe 42 as a gas supply path is connected to a center of the upper surface of the upper electrode 40. The gas introducing pipe 42 passes through the center of the upper surface of the process vessel 21 via an insulation member 27. The gas introducing pipe 42 is diverged into five branch pipes 42A to 42E on an upstream side thereof. The branch pipes 42A to 42E are connected to gas supply sources 45A to 45E via valves 43A to 43E and flow-rate control parts 44A to 44E, respectively. The gas supply sources 45A to 45E are, for example, a $CF_4$ gas source, a CO gas source a $CO_2$ gas source, an $O_2$ gas source, and an Ar gas source, respectively. The valves 43A to 43E and the flow-rate control parts 44A to 44E constitute a gas supply system 46.

The upper electrode 40 is grounded via a low-pass filter (LPF) 47. A radiofrequency power source 40a, which supplies a frequency higher than that of the radiofrequency power source 31a, is connected to the upper electrode 40 via a matching device 40b.

A radiofrequency supplied from the radiofrequency power source 40a connected to the upper electrode 40 is a radiofrequency for making a process gas into plasma. A radiofrequency supplied from the radiofrequency power source 31a connected to the lower electrode 31 is a radiofrequency for applying a bias power to a wafer W so as to draw ions in the plasma to a surface of the wafer W.

[Recovery Processing Apparatus]

Figure 2:
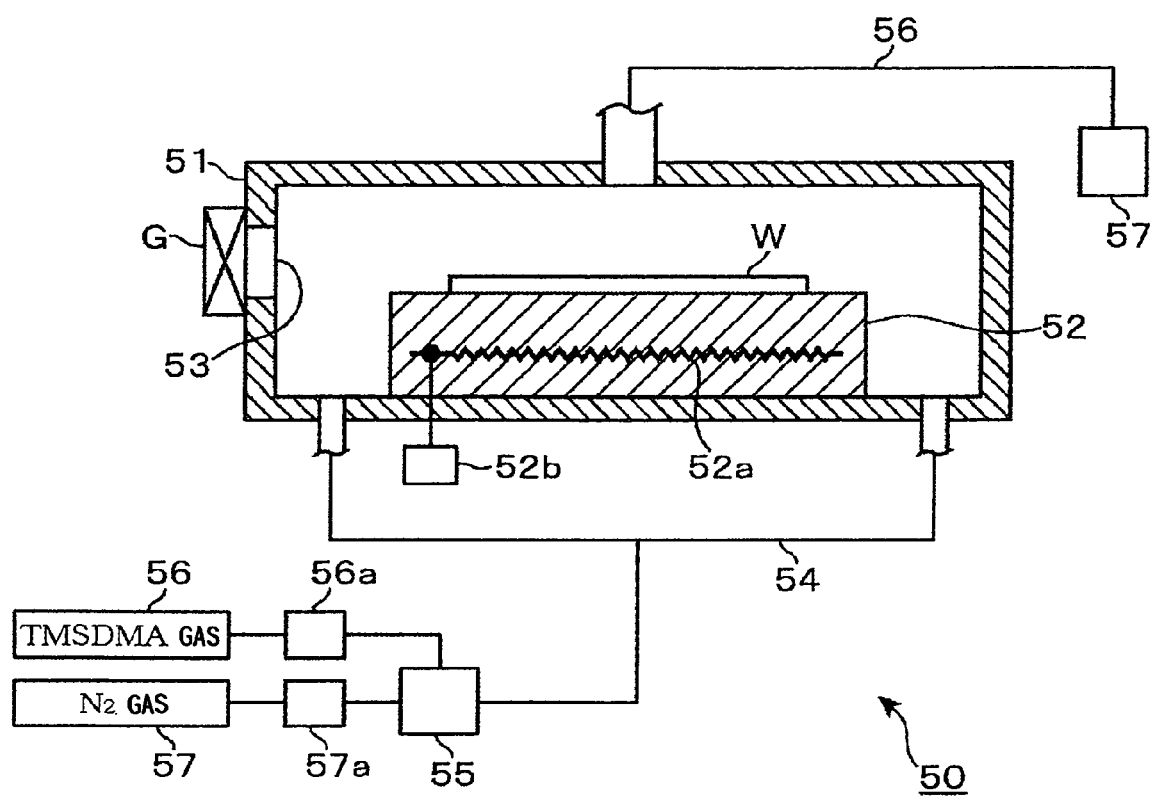
FIG. 2 is a longitudinal sectional view of an example of a recovery processing apparatus used for performing a recovering step in one embodiment of the method of manufacturing a semiconductor device according to the present invention.

Next, a recovery processing apparatus 50 is described with reference to FIG. 2. The recovery processing apparatus 50 includes a process vessel 51 and a stage 52. Disposed in the stage 52 is a heater 52a as a heating unit. The heater 52a is connected to a power source 52b, and is configured to heat a wafer W to, e.g., 50° C. to 200° C. The stage 52 has an elevating means such as pins, not shown. By means of the elevating means, a wafer W can be transported between the stage 52 and a transfer means, not shown, through a transfer port 53 formed in a sidewall of the process vessel 51. In addition, a plurality of pins, not shown, for supporting a wafer W are arranged on a surface of the stage 52. Thus, a wafer W can be supported with a slight gap between the wafer W and the surface of the stage 52, so that adhesion of particles to a rear surface of the wafer W can be restrained. The reference character G in FIG. 2 depicts a gate valve.

A plurality of, e.g., four diverged ends of a gas supply path 54 are opened to a lower surface of the process vessel 51 at an interval circumferentially equal to each other, so as to surround the stage 52. A carburetor 55 is connected to the other end of the gas supply path 54. On an upstream side of the carburetor 55, there are connected, via flow-rate controllers 56a and 57a, a TMSDMA (trimethyl silyl dimethyl amine) source 56 and a nitrogen gas source 57, respectively. Thus, TMSDMA in a liquid state is vaporized by the carburetor 55, whereby a TMSDMA gas as an organic gas can be supplied into the process vessel 51 with a nitrogen gas serving as a carrier gas. Alternatively, a pressure in the process vessel 51 is reduced, while a pressure of the TMSDMA in the carburetor 55 is set higher than the pressure in the process vessel 51, whereby the TMSDMA gas can be supplied into the process vessel 51 not by a carrier gas but by a pressure difference between the pressure in the process vessel 51 and the pressure in the carburetor 55. An exhaust path 56 is connected to a top wall of the process vessel 51 at a position opposite to a wafer W placed on the stage 52. Connected to the exhaust path 56 is a vacuum pump 57 having a pressure-adjusting part, not shown.

[Overall Structure of Apparatus]

Figure 3:
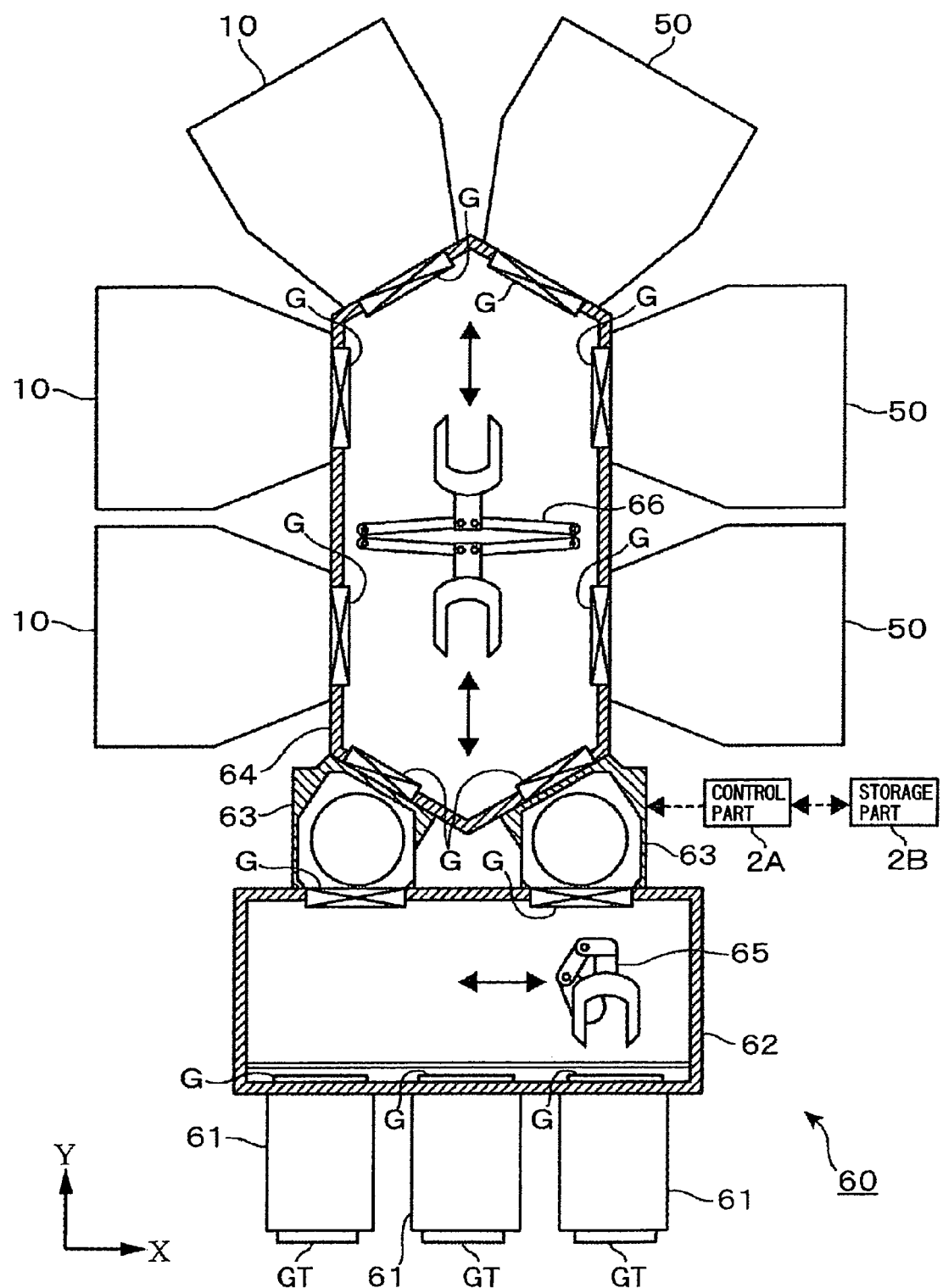
FIG. 3 is a plan view showing an example of a substrate processing apparatus to which the plasma processing apparatus shown in FIG. 1 and the recovery processing apparatus shown in FIG. 2 are connected.

As shown in FIG. 3, the aforementioned plasma processing apparatus 10 and the recovery processing apparatus 50 are structured as a part of a substrate processing apparatus 60 which is a multi-chamber system. The substrate processing apparatus 60 is simply described below. The substrate processing apparatus 60 includes a carrier chamber 61, a first transfer chamber 62 of an atmospheric air, a load lock chamber 63, and a second transfer chamber 64 of a vacuum atmosphere. The plasma processing apparatus 10 and the recovery processing apparatus 50 are hermetically connected to the second transfer chamber 64.

The first transfer chamber 62 is provided with a transfer arm 65 as a first transfer means for transporting a wafer W between the carrier chamber 61 and the load lock chamber 63. The second transfer chamber 64 is provided with a transfer arm 66 as a second transfer means for transporting a wafer W between the load lock chamber 63, the plasma processing chamber 10, and the recovery processing apparatus 50.

The substrate processing apparatus 60 is equipped with a control part 2A formed of a computer, for example. The control part 2A has a data processing part formed of a program, a memory, and a CPU. The program incorporates commands for causing the control part 2A to send control signals to respective parts of the substrate processing apparatus 60 so as to perform steps described below. The memory has a domain in which values of various process parameters such as a process pressure, a process temperature, a process period, a gas flow-rate, a power, and so on can be written. When the CPU executes the commands of the program, the values of these process parameters are read out, and control signals corresponding to the parameter values are sent to the respective parts of the substrate processing apparatus 60. The program (which may be accompanied with a program relating to an input operation of the process parameters and/or a display thereof) is generally stored in a storage part 2B formed of, e.g., a flexible disc, a compact disc, a hard disc, or an MO (magnet optic disc), and is installed in the control part 2A.

[Layer Structure and Flow of Overall Process]

Next, respective processes performed by the substrate processing apparatus 60 including the plasma processing apparatus 10 and the recovery processing apparatus 50 are described. Described herein is a case in which an $(n+1)^{th}$ circuit layer is formed as an upper layer on an $n^{th}$ circuit layer which has been formed on, e.g., an 8-inch wafer W as a substrate.

Figure 4A:
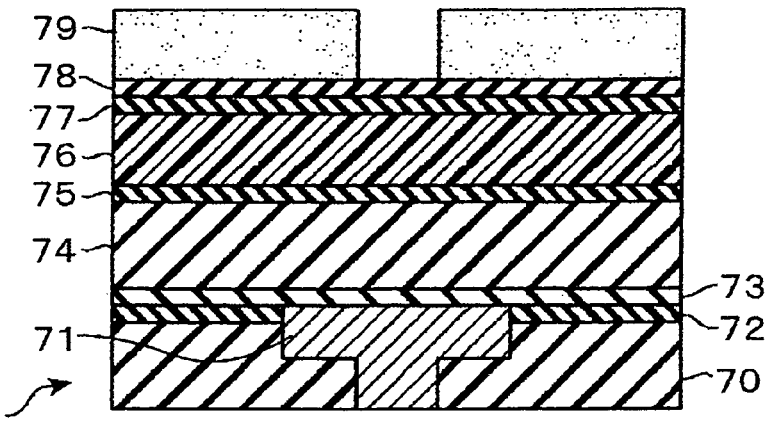
FIGS. 4A to 4C are cross-sectional views of a substrate for explaining steps in one embodiment of the method of manufacturing a semiconductor device according to the present invention.

Firstly, an example of a semiconductor substrate (hereinafter referred to as "wafer" W), to which the method of manufacturing a semiconductor device according to the present invention is performed, is described with reference to FIG. 4A. An $n^{th}$ circuit layer has a structure in which a wiring 71 formed of a metal such as Cu is embedded in an SiCOH film 70 which is an interlayer dielectric film. On an upper part of the $n^{th}$ circuit layer, a cap film 72 and a barrier film 73 are stacked in this order from below. The cap film 72 is a film for protecting the circuit layer from a mechanical impact during a CMP process, for example. The barrier film 73 is a film for restraining diffusion of Cu between the upper and lower circuit layers. Although a barrier film for restraining diffusion of the metal is also formed between the SiCOH film 70 and the wiring 71, illustration and description thereof are omitted.

Stacked on an upper part of the barrier film 73 are an SiCOH film 74, a cap film 75, a bottom resist film 76, an oxidation film 77, an anti-reflection film 78, and a photoresist mask 79 as a resist pattern, in this order from below. The photoresist mask 79 is patterned so as to form a via hole in the SiCOH film 74.

Next, processes to be performed to the above wafer W are described. A course of the wafer W in the substrate processing apparatus 60 is described at first. When a carrier, which is a transfer vessel of a wafer W, is loaded into the carrier chamber 61 from the atmospheric side via a gate door GT, the wafer W is loaded into the load lock chamber 63 by the transfer arm 65 through the first transfer chamber 62. Then, the wafer W is transferred by the transfer arm 66 to the plasma processing apparatus 10 through the second transfer chamber 64. In the plasma processing apparatus 10, the wafer W is subjected to an etching-process and an ashing process which are described below. After that, the wafer W is taken out from the plasma processing apparatus 10 by the transfer arm 66, and is transferred to the recovery processing apparatus 50. In the recovery processing apparatus 50, the wafer W is subjected to a recovery process described below. Thereafter, the wafer W is returned to the carrier through a route reverse to the loading route.

(Etching Process)

After the wafer W is horizontally placed by the transfer arm 66 on the stage 30 in the process vessel 21, the gate valve G is closed. A backside gas is continuously supplied from the gas flow path 38, and a temperature of the wafer W is adjusted to a predetermined temperature.

The process vessel 21 is evacuated by the exhaust system 23 through the exhaust pipe 24, so that the inside of the process vessel 21 is held at a predetermined vacuum degree. After that, a process gas such as a $CF_4$ gas is supplied from the gas supply system 46 at a predetermined flow rate. Subsequently, a radiofrequency of 60 MHz is supplied to the upper electrode 40 with a predetermined power. Thus, the process gas is made plasma. In addition, as a radiofrequency for biasing, a radiofrequency of 2 MHz is supplied to the lower electrode 31 with a predetermined power. By this plasma process, the anti-reflection film 78 and the oxidation film 77 are etched.

Then, the supply of the radiofrequencies and the process gas is stopped, and the process vessel 21 is evacuated. Then, a $CO_2$ gas and a CO gas as process gases are supplied into the process vessel 21 at predetermined flow rates, and radiofrequencies with predetermined powers are supplied to the upper electrode 40 and the lower electrode 31. Thus, the process gases are similarly made plasma, and the bottom resist film 76 is etched.

Figure 4B:
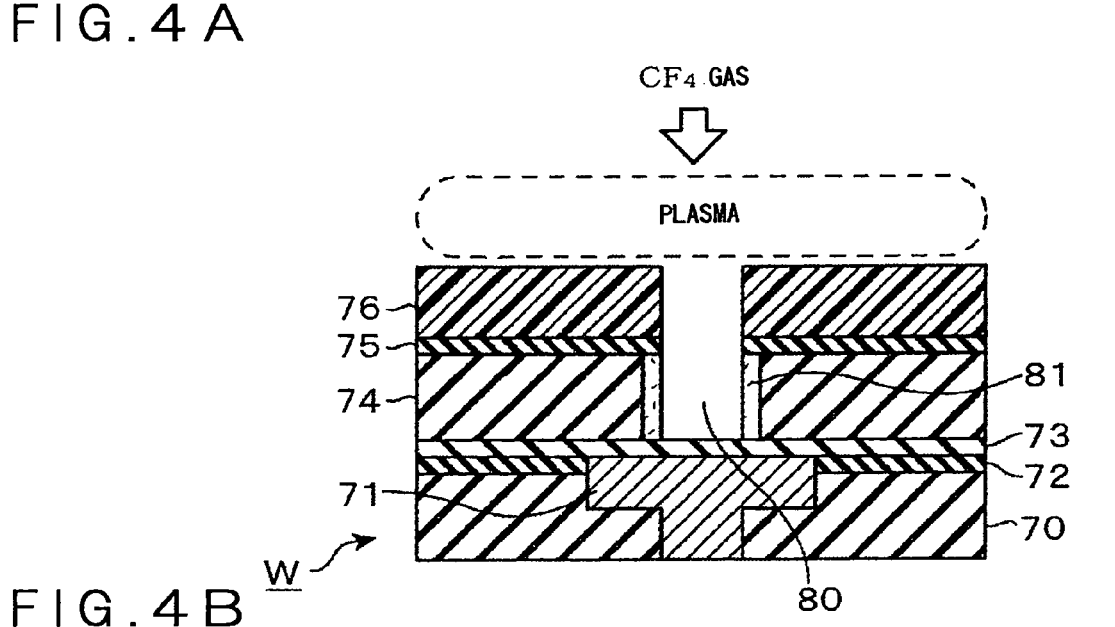

Thereafter, the supply of the radiofrequencies and the process gases is stopped, and the process vessel 21 is evacuated. Then, a $CF_4$ gas as a process gas is supplied into the process vessel 21 at a flow rate of 100 sccm, for example, and a pressure in the process vessel 21 is set at 6.67 Pa (50 mTorr), for example. Then, powers supplied to the upper electrode 40 and the lower electrode 31 are respectively set at 1000 W and 100 W, whereby the process gas is made plasma. By supplying the plasma to the wafer W, the cap film 75 and the SiCOH film 74 are etched. As shown in FIG. 4B, due to the etching process, a hole 80 is formed in the SiCOH film 74 so that a surface of the barrier film 73 is exposed.

At this time, the process gas does not include an oxygen gas. Thus, no damage is generated by a plasma of oxygen in the SiCOH film 74. However, the SiCOH film 74 is slightly damaged by an energy of the plasma of the $CF_4$ gas. Thus, a damage layer 81 is slightly formed on a sidewall of the hole 80. As described above, the damage layer 81 is a layer resulting from the desorption of the organic substance that has been connected to the silicon (Si) in the SiCOH film 74.

(Ashing Process)

Thereafter, the supply of the radiofrequencies and the process gas is stopped, and the process vessel 21 is evacuated. Then, an oxygen gas as a process gas is supplied into the process vessel 21 at a flow rate of 300 sccm, for example, and a vacuum degree is adjusted to be set at 1.33 Pa (10 mTorr) to 6.67 Pa (50 mTorr), for example. Then, a power of, e.g., 600 W ($1.91$ W/cm$^2$) to 1000 W ($3.18$ W/cm$^2$) is supplied to the upper electrode 40, so that the oxygen gas is made plasma. At the same time, a power of, e.g., 100 W ($0.32$ W/cm$^2$) to 300 W ($0.95$ W/cm$^2$) is supplied to the lower electrode 31. Thus, the oxygen gas is activated and made plasma, so as to thereby generate oxygen ions and oxygen radicals. At this time, since the plasma density is increased by adjusting the process condition as described above (raising the process pressure, and raising the power to be supplied to the upper electrode 40), an oxygen ion concentration in the plasma is considerably decreased, while a radical concentration is increased. Further, since the power to be supplied to the lower electrode 31 is lowered as described above, the oxygen ions are not intensively attracted to the wafer W, but the radicals which have been generated in large quantity flow toward the wafer W.

Figure 4C:
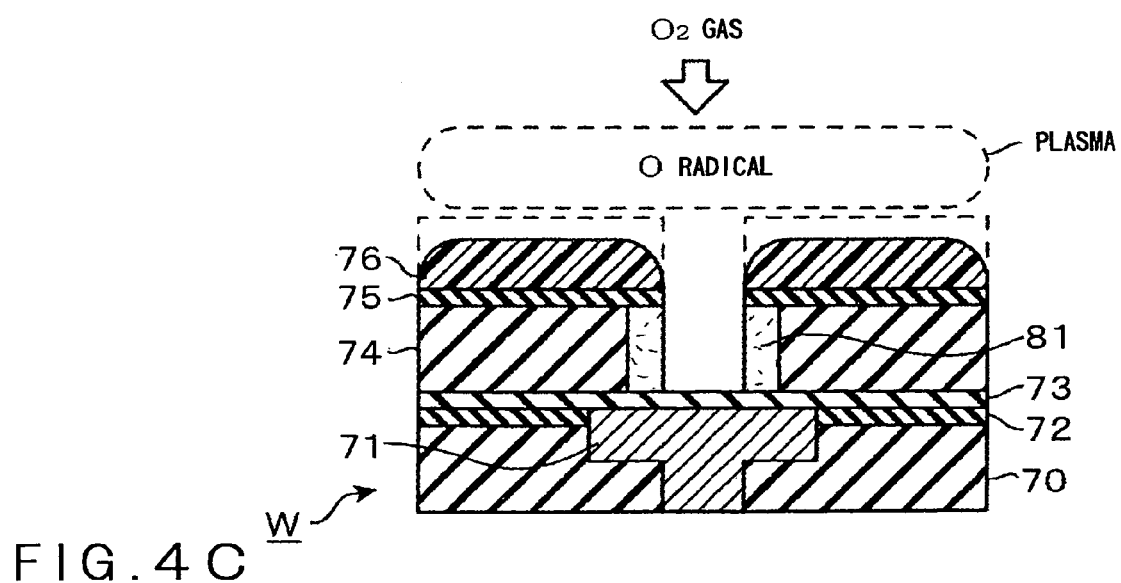

When such a plasma is supplied to the wafer W, as shown in FIG. 4C, the bottom resist film 76 which is an organic film is ashed and removed. In addition, when the sidewall of the SiCOH film 74 (side surface of the hole 80) is exposed to the plasma, an organic substance such as a methyl group is desorbed from the inside of the film. Due to the desorption of the methyl groups, a dangling bond that is highly active (reactive) is generated in Si in the SiCOH film 74. Moisture slightly contained in the process gas and/or moisture generated by a reaction between the oxygen gas and hydrogen in the SiCOH film 74 is bonded with the dangling bond, so that an Si—OH bond is formed.

Figures 5A, 5B, 5C:
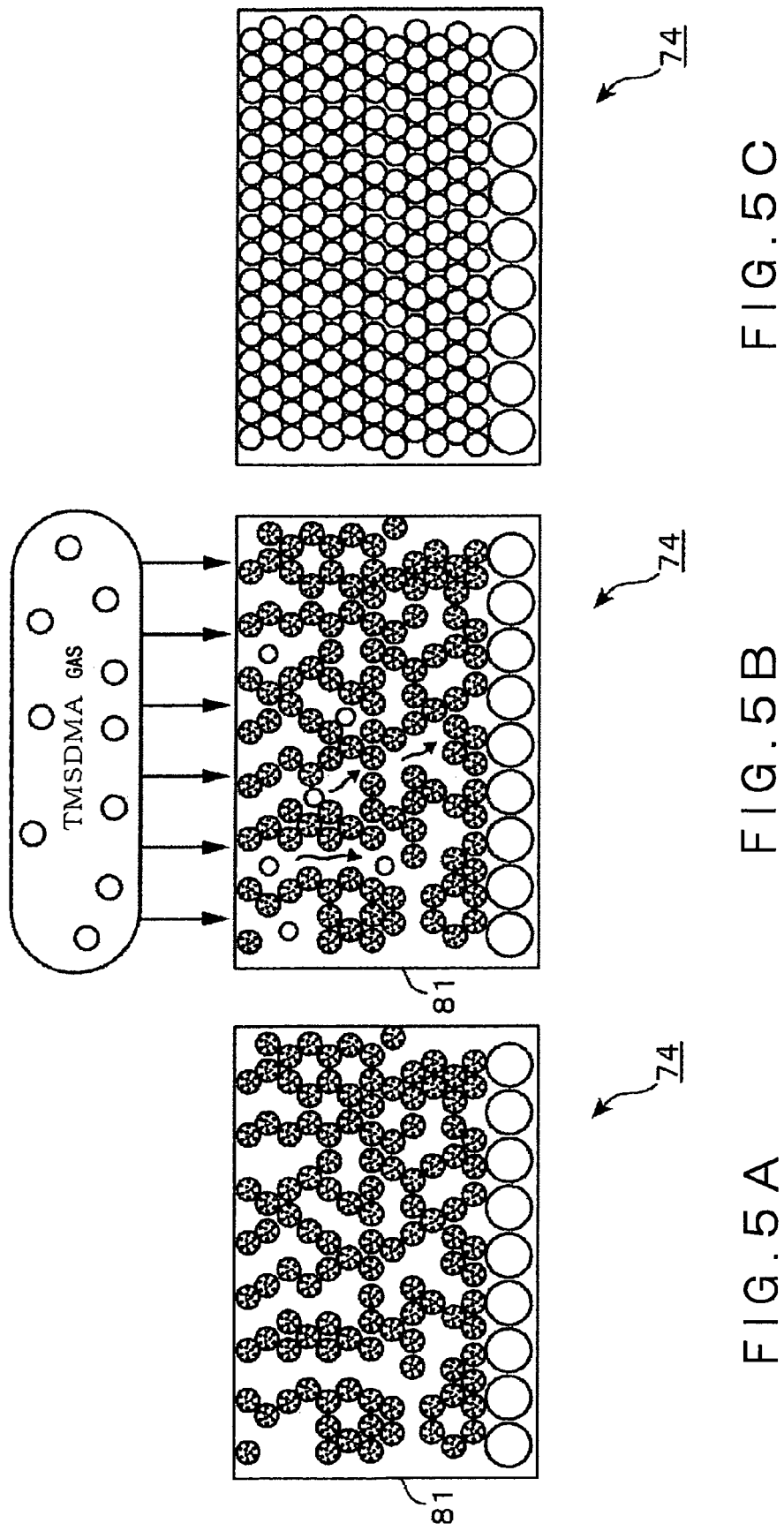
FIGS. 5A to 5C schematic views for explaining states of a substrate surface during the recovering step in one embodiment of the method of manufacturing a semiconductor device according to the present invention.

The oxygen plasma invades the inside of the SiCOH film 74 through voids formed by the desorption of the methyl groups, so that methyl groups inside the SiCOH film 74 are sequentially desorbed from the SiCOH film 74, resulting in the formation of the damage layer 81. Oxygen ions would make denser the damage layer 81 by an energy thereof. However, since the plasma formed under the above condition is poor in oxygen ions but is rich in oxygen radicals, the plasma is less likely to make denser the damage layer 81. Thus, as shown in FIG. 5A, the damage layer 81 remains porous with the voids formed by the desorption of the organic substance having been left as they are. As described above, when the plasma rich in oxygen radicals is used, the increase in density of the damage layer 81 can be prevented. Thus, since the oxygen radicals can permeate to the inside, the thickness of the damage layer 81 is increased (the depth of the damage layer 81 is increased), whereby a relative dielectric constant is increased.

(Recovery Process)

Thereafter, the supply of the radiofrequencies and the process gas is stopped, and the process vessel 21 is evacuated. Then, the wafer W is taken out from the process vessel 21 by the transfer arm 66, and is loaded into the process vessel 51 of the aforementioned recovery processing apparatus 50. On the stage 52, the wafer W is heated to a predetermined set temperature of, e.g., 150° C. Then, a TMSDMA gas is supplied at a flow rate of, e.g., 500 sccm, until a pressure in the process vessel 51 reaches 6.67 kPa (50 Torr), for example. After that, the supply of the TMSDMA gas is stopped, and the process vessel 51 is closed to provide a closed space. This state is held for 150 seconds, for example.

The TMSDMA gas diffuses in the process vessel 51 and permeates the surface of the wafer W so as to reach the hole 80 and further the surface of the damage layer 81. As described above, since the damage layer 81 is porous, the TMSDMA gas deeply invades the inside of the damage layer 81 from the surface thereof, which is shown in FIG. 5B. As described above, the damage layer 81 is a part formed by the desorption of the organic substance from the SiCOH film 74, and the silicon in this part includes highly active dangling bonds. Meanwhile, the TMSDMA gas has reactive radicals such as methyl groups that have a weak bonding force and thus can be easily desorbed from the TMSDMA gas. Thus, when the TMSDMA gas comes into contact with the silicon including the dangling bonds, the methyl groups are rapidly taken by the silicon. Further, the TMSDMA gas also acts on another silicon to which moisture has been bonded. Specifically, the moisture is desorbed from the SiCOH film 74, and the methyl groups are bonded to the silicon from which the moisture has been desorbed.

Figure 6A:
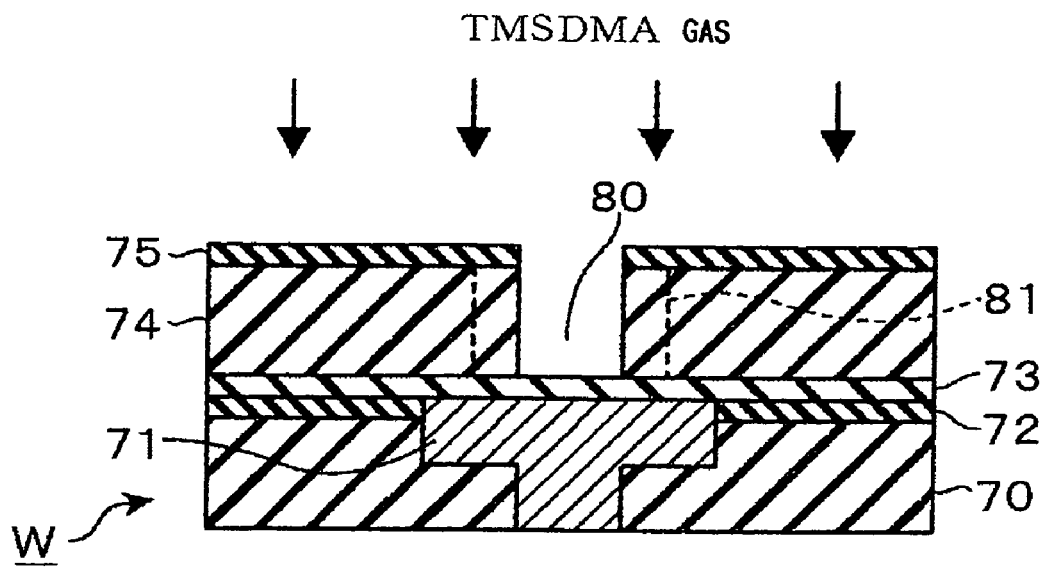
FIGS. 6A and 6B are cross-sectional views for explaining states of a substrate surface after the recovering step in one embodiment of the method of manufacturing a semiconductor device according to the present invention.

When the methyl groups are sequentially brought from the TMSDMA gas to the silicon, the concentration of the TMSDMA gas in the damage layer 81 is decreased. The TMSDMA gas continuously diffuses inside the damage layer 81, and the reaction between the silicon and the TMSDMA gas further proceeds. Thus, as shown in FIG. 5C and FIG. 6A, the recovery process of the damage layer 81 is performed. (When the methyl groups are taken out from the TMSDMA gas, a by product gas is generated. Since molecules of the by-product gas are small, the gas goes outside the hole 80 through gaps between molecules forming the SiCOH film 74.)

Figure 6B:
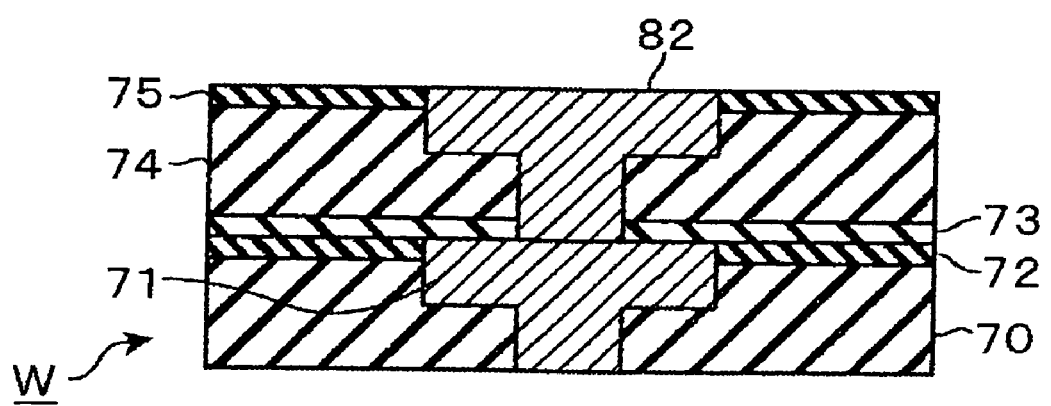

Thereafter, the process vessel 51 is evacuated, and the wafer W is taken out from the process vessel 51. Then, a new resist pattern is formed, and a groove (trench), by which a wiring can be embedded in the SiCOH film 74, is formed by using this resist pattern. After Cu has been embedded in a recess formed of the groove and the hole 80, a CMP process is performed. Then, as shown in FIG. 6B, an $(n+1)^{th}$ wiring 82 is formed.

In the above embodiment, as the ashing process condition, the process pressure is set at a value between 1.33 Pa and 6.67 Pa, and the power supplied from the upper electrode 40 is set at a value between 600 W (1.91 W/cm$^2$) and 1000 W (3.18 W/cm$^2$), in order to obtain a plasma that is poor in oxygen ions and rich in oxygen radicals. The ashing process is performed to the exposed SiCOH film 74 by this plasma. Thus, formation of a dense layer with a higher density can be restrained at the surface layer of the SiCOH film 74. Accordingly, the TMSDMA gas used in the recovery process can deeply permeate into the damage layer 81, whereby a recovery ratio of the damage (recovery ratio of the electric properties) can be enhanced. As a result, a semiconductor device having favorable electric properties can be obtained.

This embodiment can be explained in the following manner. That is to say, conventionally, the ashing process is performed with an ashing process condition adjusted such that electric properties after the ashing process are the best, and then the recovery process is performed. On the other hand, in this embodiment, based on an idea reverse to the conventional idea, by adjusting the ashing condition such that the properties after the ashing process are worse as compared with the properties after the conventional ashing process, the recovery ratio of the electric properties can be increased by the succeeding recovery process.

To be specific, in the ashing process for the 8-inch wafer W, the power to be supplied to, e.g., the upper electrode 40, which is a power for generating a plasma, is set at 600 W or more, so as to make worse the properties of the SiCOH film 74 after the ashing process. As understood from the below examples, the ashing process under this condition results in that the relative dielectric constant of the SiCOH film 74 becomes 5.2 or more.

However, when the relative dielectric constant of the SiCOH film 74 after the ashing process is excessively larger than 5.2, the damage recovery ratio of the film in the subsequent recovery process is considered to be unsatisfactory. Specifically, it is not desirable that the relative dielectric constant of the film after the recovery process is over 3.2.

As clearly seen from the result of the below examples, by adjusting the ashing condition as described above, an ashing rate can be raised. Thus, a throughput can be advantageously improved.

In order to prevent the invasion of the plasma into the hole 80, the power to be supplied to the lower electrode 31 during the ashing process is preferably set at a value between 100 W (0.32 W/cm$^2$) and 300 W (0.95 W/cm$^2$).

In addition to the TMSDMA gas, the gas used for the recovery process may, be a DMC (dimethyl carbonate) gas as shown in the below examples. Alternatively, the gas may be another organic gas used in the conventional recovery process.

In addition, the film to which the ashing process and the recovery process of the present invention are applied, is not limited to the SiCOH film 74, and may be a film containing Si, C, and O. In the above embodiment, when the recovery process is performed, the TMSDMA gas is supplied into the process vessel 51 until the pressure therein reaches 6.67 kPa (50 Torr), and thereafter the supply of the TMSDMA gas is stopped. However, it is possible to adjust the pressure in the process vessel 51 at the above value by supplying thereinto the TMSDMA gas simultaneously with evacuating the process vessel 51 (it is also possible to adjust a flow rate and a volume of displacement of the TMSDMA gas).

Moreover, as the apparatus for performing the etching process and the ashing process, there may be used a parallel-plate type of plasma processing apparatus in which two frequencies are applied to a lower electrode. Further, the etching process and the ashing process may be performed in separate chambers.

(Experiment 1)

Figure 7:
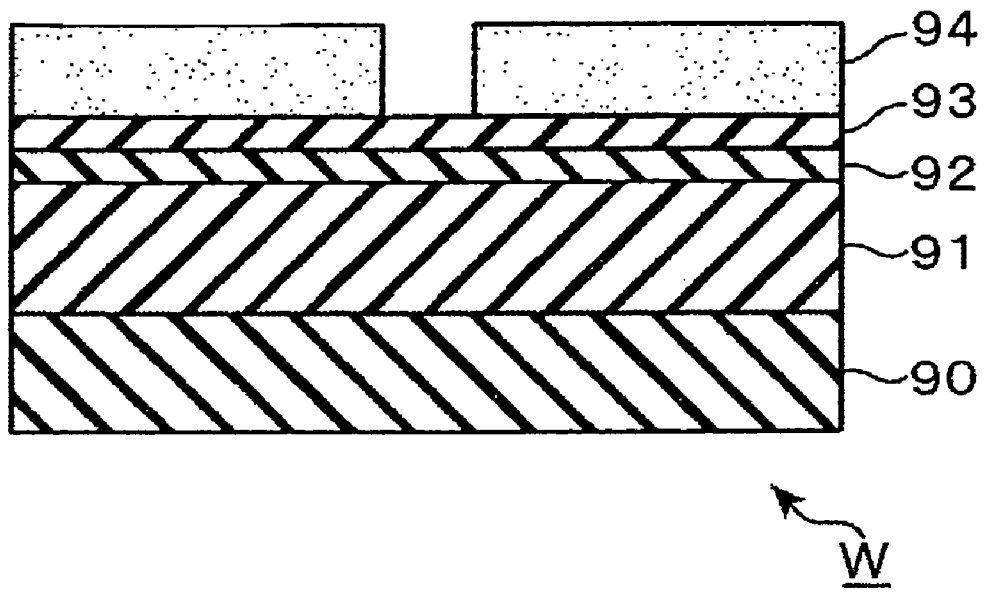
FIG. 7 is a cross-sectional view showing a structure of a substrate used in Experiment 1 of the present invention.

Next, an experiment conducted for confirming the effect of the present invention is described. In the experiment, there was used, as shown in FIG. 7, an 8-inch (200 mm) wafer W in which an SiCOH film 91, an oxidation film 92, an antireflection film 93, and a photoresist mask 94 were stacked in this order from below on an SiC film 90. A predetermined recess had been patterned in the photoresist mask 94.

Firstly, by using the wafer W, an experiment for seeking a process condition that makes smaller the damage layer 81 was conducted.

After the etching process and the ashing process were performed in the aforementioned plasma processing apparatus 10, the recovery process was performed in the recovery processing apparatus 50. With respect to the respective process conditions, the etching process condition and the recovery process condition were unchanged, while the ashing process condition was changed as shown in the below Table 1.

As Comparative Example 1-3, an experiment was conducted under an ashing process condition (conventional ashing condition heretofore used) which made best the state of the wafer such as electric properties after the ashing process. In addition, as Comparative Example 1-4, an experiment was conducted under the same condition as that of Example 1-2, except that a power to the upper electrode 40 was set at 1500 W in the ashing process, and that a DMC (dimethyl carbonate) gas was used as a process gas for the recovery process.

The respective wafers W, which had been subjected to the recovery process, were immersed into a hydrofluoric acid solution of 5% by weight. The aforementioned damage layer 81 will be dissolved in the hydrofluoric acid, while the SiCOH film 91 will be resistant to be dissolved in the hydrofluoric acid. Taking advantage of these phenomena, a quantity of the damage layer 81 was evaluated by measuring a width of the recess which had been broadened by the immersion of the wafer into the hydrofluoric acid. The width of the recess was measured by observing the cross section of the wafer W by an SEM with the enlargement ratio of 150 k times.

The respective process conditions were as follows.
(Etching Process Condition)
  Etching of Anti-reflection Film 93
  Process pressure: 6.67 Pa (50 mTorr)
  Power of upper electrode 40: 1000 W
  Power of lower electrode 31: 100 W
  Process gas: $CF_4$ gas=100 sccm
  Process period: 70 seconds
  Main Etching
  Process pressure: 6.67 Pa (50 mTorr)
  Power of upper electrode 40: 1200 W
  Power of lower electrode 31: 1700 W
  Process gas: $CF_4$ gas/Ar gas/$N_2$ gas=5/1000/150 sccm
  Process period: 25 seconds
(Ashing Process Condition)
  Process gas: $O_2$ gas=300 sccm

TABLE 1

|  | Process pressure Pa (mTorr) | Power of upper electrode 40 W | Power of lower electrode 31 W | Process period sec |
|---|---|---|---|---|
| Example 1-1 | 6.67 (50) | 600 | 100 | 36 |
| Example 1-2 | 6.67 (50) | 1000 | 100 | 34 |
| Comparative Example 1-1 | 6.67 (50) | 1500 | 100 | 29 |
| Comparative Example 1-2 | 13.33 (100) | 1500 | 100 | 36 |
| Comparative Example 1-3 | 1.33 (10) | 300 | 300 | 42 |
| Comparative Example 1-4 | 6.67 (50) | 1500 | 100 | 34 |

(Recovery Process Condition)
  Process pressure: 6.67 kPa (50 Torr)
  Process gas: TMSDMA gas=500 sccm
  Process period: 150 seconds
  Temperature for heating wafer W: 150° C.
(Experiment Result)
  The experiment result is shown in Table 2.

TABLE 2

|  | Increase in width of recess (quantity of damage layer 81) nm | Ashing rate nm/min |
|---|---|---|
| Example 1-1 | 16 | 715.5 |
| Example 1-2 | 16 | 763.8 |
| Comparative Example 1-1 | 28 | 887.1 |
| Comparative Example 1-2 | 34 | 717.1 |
| Comparative Example 1-3 | 14 | 610.5 |
| Comparative Example 1-4 | 23 | 763.8 |

The result shows that the damage layer 81 was deteriorated in Comparative Examples 1-1, 1-2, and 1-4.

In Examples 1-1 and 1-2, the ashing rate was improved as compared with that of the conventional condition (Comparative Example 1-3).

From the above result, it was understood that, when the power supplied to the upper electrode 40 was increased to a range between 600 W and 1000 W, the seeming quantity of the damage layer 81 was close to the quantity of the damage layer 81 formed by the conventional method in which the power supplied to the upper electrode was 300 W, while the ashing rate was improved.

When the power of the upper electrode 40 is increased, it is considered that the oxygen ion concentration in the plasma is decreased, as described above. However, from the result shown in Table 2, it can be said that, when the power is increased at as large as 1500 W, the damage caused by the oxygen radicals are so serious that the damage cannot be recovered by the next recovery process.

Similar to the TMSDMA gas, it was found that the quantity of the damage layer 81 was decreased by using the DMC gas (Comparative Example 1-4).

Further, with respect to Examples 1-1 and 1-2 and Comparative Example 1-3, the etching process and the ashing process were conducted, and then the hydrofluoric-acid immersion test was conducted without performing the recovery process. The quantities of the damage layer 81 were 26 nm, 30 nm, and 22 nm, respectively. From this result, it was understood that, in Examples 1-1 and 1-2, although the seeming quantity of the damage layer 81 was increased after the ashing process, the quantity of the damage layer 81 was recovered to a level close to the quantity of the damage layer 81 in Comparative Example 1-3 (supply power to the upper electrode 40 was 300 W).

A film reduction of the SiC film 90 was confirmed, but no difference was found between the wafers.

(Experiment 2)

Figure 8:
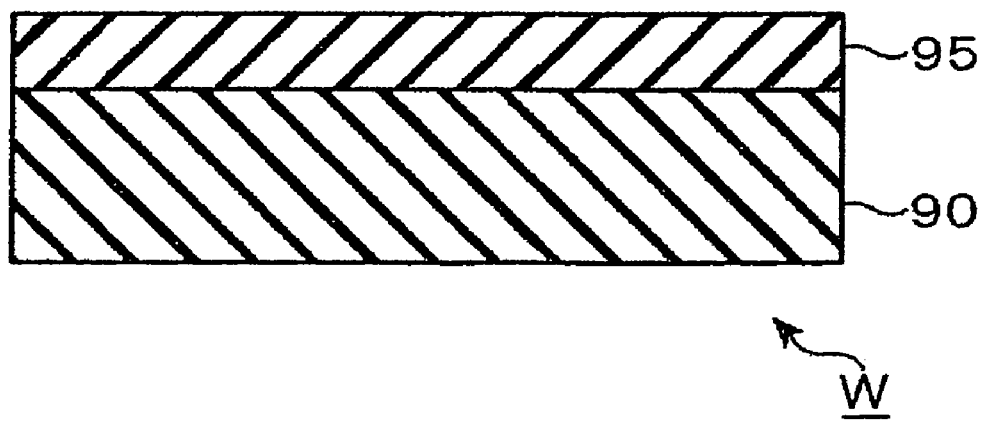
FIG. 8 is a cross-sectional view showing a structure of a substrate used in Experiment 2 of the present invention.
Figure 10:
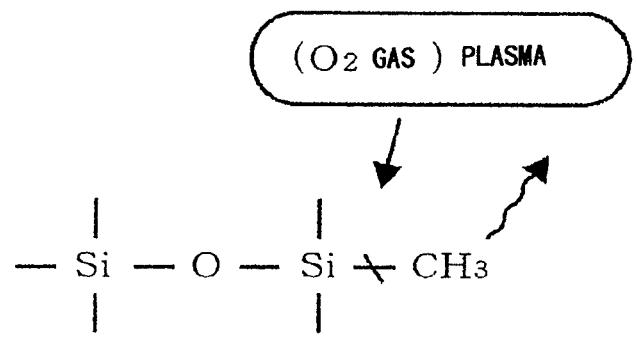
FIGS. 10A to 10C are schematic views for explaining a damage of a conventional organic low dielectric constant film caused by a plasma.
Figure 10:
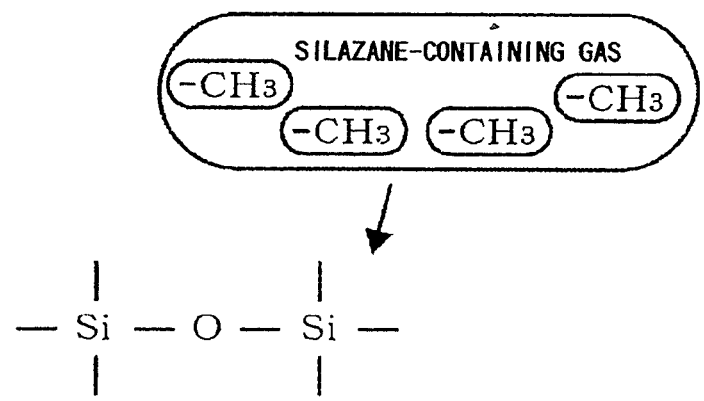
Figure 10:
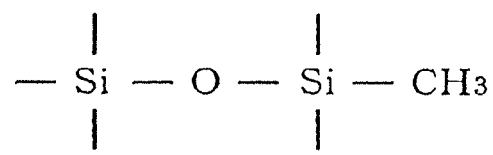
Figure 11:
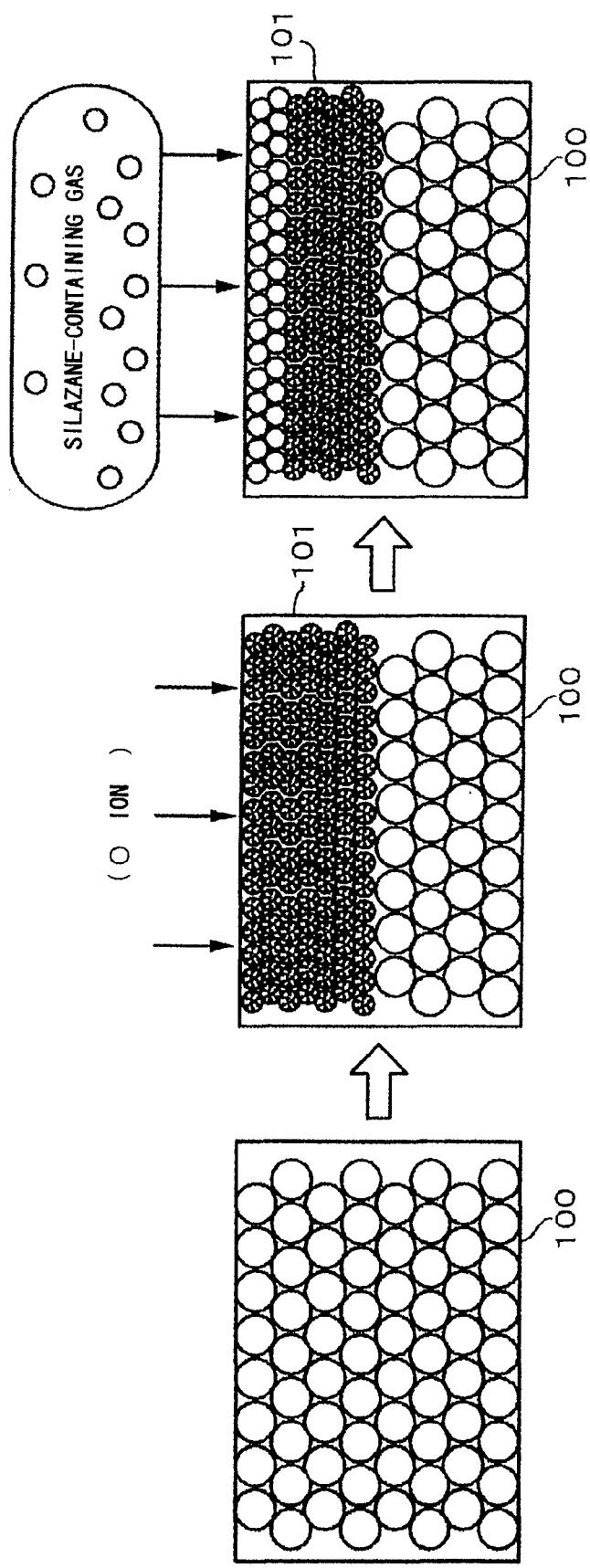
FIG. 11 is a schematic view for explaining a conventional recovery state of a damage caused by a plasma.

Next, an experiment for evaluating electric properties was conducted. As shown in FIG. 8, an SiCOH film 95 having a relative dielectric constant of 2.4 was deposited as a blanket film on an 8-inch wafer W for the experiment, and the etching process, the ashing process and the recovery process were performed to the wafer W. Excluding the following conditions, the respective process conditions were unchanged from the conditions in Experiment 1. For comparison, samples were manufactured by performing the etching process and the ashing process, but without performing the recovery process.

Following thereto, a relative dielectric constant, a leak current, a moisture content, and a carbon amount were measured. For comparison, the electric properties except for the leak current were similarly measured with respect to the samples which had not been subjected to the recovery process. In addition, the electric properties of a wafer W before it underwent the experiment (after the SiCOH film 95 was deposited) were similarly measured (Reference).

Publicly known methods were used for the measurement for the relative dielectric constant and the leak current (details of which are omitted).

In the measurement of the moisture content, the moisture content was obtained by integrating the amount of moisture desorbed from the wafer W when a temperature of the wafer W was increased to 100° C. to 500° C., in accordance with a TDS (thermal desorption spectroscopy).

In the measurement of the carbon amount, a ratio of the carbon amount relative to the silicon amount in the film was calculated in accordance with an XPS (x-ray photoelectron spectroscopy). In addition, at this time, the wafer W was spattered, and there was confirmed how the carbon amount was changed in the depth direction of the wafer W depending on the duration of the spattering period.

(Etching Process Condition)
  Process pressure: 10.0 Pa (75 mTorr)
  Power of upper electrode 40: 1500 W
  Power of lower electrode 31: 100 W
  Process gas: $CF_4$ gas/Ar gas=80/160 sccm
  Process period: 10 seconds
(Ashing Process Condition)
  Example 2-1: the same as Example 1-1 except for the process period which was set at 25 seconds Example 2-2: the same as Example 1-2 except for the process period which was set at 23 seconds Comparative Example 2: the same as Comparative Example 1-3 except for the process period which was set at 29 seconds (Experiment Result)

Results of the relative dielectric constant, the leak current, and the moisture content are shown in Table 3.

TABLE 3

| | | Relative dielectric constant | Leak current A/cm2 @1 MV/cm | Moisture Content |
|---|---|---|---|---|
| Before recovery process | Example 2-1 | 5.2 | — | 7.60E−08 |
| | Example 2-2 | 6.14 | — | 7.10E−08 |
| | Comparative Example 2 | 4.11 | — | 8.90E−08 |
| After recovery process | Example 2-1 | 2.90 | 2.10E−09 | 3.98E−08 |
| | Example 2-2 | 2.93 | 5.60E−09 | 3.87E−08 |
| | Comparative Example 2 | 2.84 | 1.77E−08 | 4.17E−08 |
| Not-processed (Reference) | Reference | 2.24 | 5.82E−10 | 2.00E−08 |

Before the recovery process, in Examples 2-1 and 2-2, the relative dielectric constant was increased (deteriorated) as compared with that of Comparative Example 2. However, due to the performance of the recovery process, the relative dielectric constant was lowered, i.e., improved to substantially the same degree as that of Comparative Example 2 (conventional process condition).

On the other hand, as compared with Comparative Example 2, the leak current and the moisture content were improved by performing the recovery process. In particular, the leak current is considerably (about one tenth) decreased.

From the above result, it was understood that, according to the method of the present invention, the electric properties were remarkably recovered, which cannot be confirmed from the evaluation of the seeming quantity of the damage layer 81 in the above Example 1.

The peak position of moisture (heating temperature at which the peak becomes the largest) obtained by the TDS differed between Examples 2-1 and 2-2 and Comparative Example 2. From this point, it is considered that an adsorption factor (adsorption state) of moisture or a depth of the damage layer 81 (depth to which the moisture adheres) differed between Examples 2-1 and 2-2 and Comparative Example 2.

Next, the measurement result of the carbon amount is shown in FIGS. 9A and 9B. In Example 2-2, by performing the ashing process, the damage layer 81 extended deeply inside the wafer W, and the carbon amount was decreased. However, due to the performance of the recovery process, the TMSDMA gas invaded the inside of the wafer W, so that a distinguishably high recovery ratio could be obtained.

The reason therefor is considered as follows. Namely, as described above, since the amount of oxygen ions is made smaller while the amount of oxygen radicals is made larger in the plasma used for the ashing process, no dense layer is formed on the damage layer 81. Thus, the recovery process is performed to the damage layer 81 in which the voids remain.

On the other hand, in Comparative Example 2, it was understood that, although the damage layer 81 at the ashing process did not extend deeply into the wafer W, the carbon amount was not remarkably recovered by the recovery process.

The reason therefor is considered as follows. Namely, since a dense layer is formed by the energy of the oxygen ions on the damage layer 81 positioned on the surface of the wafer W, the dense layer serves as a solid obstacle and makes it difficult for the TMSDMA gas to diffuse in the wafer W.

In FIGS. 9A and 9B, the result of Experiment 2-1 is omitted.

The invention claimed is:

1. A method of manufacturing a semiconductor device using a substrate including an organic low dielectric constant film containing a silicon with a resist pattern being formed on an upper layer side of the low dielectric constant film, the method comprising:
    an etching step in which the substrate is loaded in to a plasma processing apparatus and the low dielectric constant film is etched by a plasma;
    an ashing step following to the etching step, in which the resist pattern is ashed by a plasma of a $CO_2$ gas in the plasma processing apparatus; and
    a recovering step following to the ashing step, in which a dimethyl carbonate gas is supplied to the low dielectric constant film so as to recovery a damage of the low dielectric constant film caused by the plasma.

2. The method of manufacturing a semiconductor device according to claim 1, wherein
    the organic low dielectric film containing a silicon further contains a carbon, an oxygen and a hydrogen.

3. The method of manufacturing a semiconductor device according to claim 1, wherein
    the recovering step is performed in another processing chamber different from one or more processing chambers in which the etching step and ashing step are performed.

4. The method of manufacturing a semiconductor device according to claim 1, wherein
    the ashing step is performed under a condition that does not make denser the damage of the low dielectric constant film.

5. The method of manufacturing a semiconductor device according to claim 1, wherein
    the ashing step is performed under a process pressure set at a value between 1.33 Pa and 6.67 Pa.

6. The method of manufacturing a semiconductor device according to claim 1, wherein
    the ashing step is performed in the plasma processing apparatus under a condition wherein power for generating the plasma applied to the substrate on a lower electrode is between 1.91 W/cm$^2$ and 3.18 W/cm$^2$ per unit surface area of the substrate.

7. The method of manufacturing a semiconductor device according to claim 1, wherein
    the substrate is placed in an atmosphere including moisture between the ashing step and the recovery step.

* * * * *